US007875118B2

(12) United States Patent
Oyama et al.

(10) Patent No.: US 7,875,118 B2
(45) Date of Patent: Jan. 25, 2011

(54) CRYSTALLIZATION METHOD AND CRYSTALLIZATION APPARATUS

(75) Inventors: Yasunao Oyama, Tokyo (JP); Kazutaka Terashima, Kanagawa (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 11/876,274

(22) Filed: Oct. 22, 2007

(65) Prior Publication Data

US 2008/0134962 A1 Jun. 12, 2008

Related U.S. Application Data

(63) Continuation of application No. 11/098,959, filed on Apr. 4, 2005, now abandoned.

(30) Foreign Application Priority Data

Apr. 5, 2004 (JP) .............................. 2004-110836

(51) Int. Cl.
*C30B 25/12* (2006.01)
(52) U.S. Cl. .................... 117/200; 117/202; 117/205
(58) Field of Classification Search .......... 117/200–220
See application file for complete search history.

(56) References Cited

U.S. PATENT DOCUMENTS

| 1,563,523 | A | * | 12/1925 | Petersson | 164/257 |
| 2,214,976 | A | * | 9/1940 | Stockbarger | 117/223 |
| 2,281,528 | A | * | 4/1942 | Berger | 75/308 |
| 2,686,212 | A | * | 8/1954 | Horn et. al. | 373/156 |
| 2,822,308 | A | * | 2/1958 | Hall | 148/33.5 |
| 2,890,939 | A | * | 6/1959 | Ravich | 117/3 |
| 2,892,739 | A | * | 6/1959 | Rusler | 117/21 |
| 2,962,363 | A | * | 11/1960 | Martin | 117/33 |
| 2,982,535 | A | * | 5/1961 | Hiskey et. al. | 266/216 |
| 3,002,906 | A | * | 10/1961 | Ervin et al. | 205/45 |
| 3,053,639 | A | * | 9/1962 | Dolloff | 117/207 |
| 3,074,785 | A | * | 1/1963 | Gremmelmaier | 117/216 |
| 3,092,490 | A | * | 6/1963 | Ednie | 75/443 |
| 3,129,083 | A | * | 4/1964 | Labino | 65/458 |
| 3,261,671 | A | * | 7/1966 | De Jonge et. al. | 117/203 |
| 3,291,574 | A | * | 12/1966 | Pierson | 117/23 |
| 3,321,300 | A | | 5/1967 | Worner | |
| 3,337,303 | A | * | 8/1967 | Lorenzini | 117/217 |
| 3,427,863 | A | * | 2/1969 | Schultz | 73/23.25 |
| 3,481,711 | A | * | 12/1969 | Mitsuhiro | 117/202 |
| 3,545,960 | A | * | 12/1970 | Kozak et al. | 75/546 |

(Continued)

FOREIGN PATENT DOCUMENTS

EP          921215 A1      6/1999

(Continued)

OTHER PUBLICATIONS

English translation of Single Crystal Growth Technology, Tsuguo Fukuda, et al., Baifukan Co. Ltd., pp. 199-203.

*Primary Examiner*—Robert M Kunemund
(74) *Attorney, Agent, or Firm*—Rossi, Kimms & McDowell LLP

(57) ABSTRACT

A crystallization method includes the steps of melting a crystallized material in a crucible by heating, and growing a crystal by cooling and coagulating the melted material, wherein said melting step includes introducing a predetermined gas into the melted material.

2 Claims, 8 Drawing Sheets

U.S. PATENT DOCUMENTS

| | | | |
|---|---|---|---|
| 3,591,348 A | 7/1971 | La Belle | |
| 3,764,286 A * | 10/1973 | Antczak et al. | 65/135.6 |
| 3,769,230 A * | 10/1973 | Devor et al. | 252/301.4 H |
| 3,798,140 A * | 3/1974 | Sullivan et al. | 205/394 |
| 3,826,625 A | 7/1974 | Bailey | |
| 3,915,656 A | 10/1975 | Mlavsky et al. | |
| 3,923,464 A * | 12/1975 | Sitek et al. | 422/78 |
| 4,214,899 A * | 7/1980 | Radzilowski | 75/546 |
| 4,224,897 A * | 9/1980 | Dugdale | 118/719 |
| 4,282,184 A * | 8/1981 | Fiegl et al. | 117/202 |
| 4,309,025 A * | 1/1982 | Meichsner | 266/216 |
| 4,379,733 A | 4/1983 | Pastor et al. | |
| 4,443,411 A * | 4/1984 | Kalejs | 117/211 |
| 4,539,032 A * | 9/1985 | Tran et al. | 65/32.5 |
| 4,649,624 A | 3/1987 | Reedy | |
| 4,865,833 A * | 9/1989 | Laundon et al. | 423/633 |
| 4,898,834 A * | 2/1990 | Lockwood et al. | 438/796 |
| 4,902,342 A * | 2/1990 | Wahlbeck | 75/631 |
| 4,925,475 A * | 5/1990 | Mimura et al. | 65/48 |
| 4,940,572 A * | 7/1990 | Laundon et al. | 423/633 |
| 5,015,291 A * | 5/1991 | Skach et al. | 75/531 |
| 5,037,503 A * | 8/1991 | Kajimoto et al. | 117/31 |
| 5,055,169 A * | 10/1991 | Hock et al. | 427/531 |
| 5,085,330 A * | 2/1992 | Paulin | 215/6 |
| 5,106,763 A * | 4/1992 | Bathey et al. | 438/62 |
| 5,180,079 A * | 1/1993 | Jeng | 220/705 |
| 5,312,014 A * | 5/1994 | Hamlin | 220/703 |
| 5,359,452 A | 10/1994 | Nitanda et al. | |
| D371,048 S * | 6/1996 | Green | D7/510 |
| 5,544,195 A * | 8/1996 | Hardt et al. | 373/79 |
| 5,673,789 A * | 10/1997 | Degraff-Eugene | 206/217 |
| D397,911 S * | 9/1998 | Waldmann | D7/507 |
| 5,851,956 A * | 12/1998 | Namikawa et al. | 505/450 |
| 5,899,256 A * | 5/1999 | Rohatgi | 164/97 |
| 5,993,902 A * | 11/1999 | Heid | 427/237 |
| 6,036,932 A * | 3/2000 | Hongu et al. | 423/348 |
| 6,039,801 A * | 3/2000 | Holder et al. | 117/20 |
| 6,153,011 A * | 11/2000 | Pandelisev | 117/200 |
| 6,238,479 B1 | 5/2001 | Oba | |
| 6,245,287 B1 * | 6/2001 | Kokubo et al. | 266/275 |
| 6,277,351 B1 * | 8/2001 | Swinehart | 423/462 |
| 6,315,828 B1 * | 11/2001 | Holder et al. | 117/208 |
| 6,379,419 B1 * | 4/2002 | Celik et al. | 75/346 |
| 6,423,136 B1 * | 7/2002 | Swinehart | 117/82 |
| 6,565,654 B2 | 5/2003 | Yokoyama et al. | |
| 6,602,327 B2 | 8/2003 | Morse et al. | |
| 6,702,891 B2 | 3/2004 | Chiba | |
| 6,733,585 B2 * | 5/2004 | Inagaki et al. | 117/13 |
| 6,770,137 B2 * | 8/2004 | Hara et al. | 117/201 |
| 6,773,501 B2 | 8/2004 | Kerdoncuff et al. | |
| 6,802,901 B2 | 10/2004 | Kerdoncuff et al. | |
| 6,813,070 B2 | 11/2004 | Oyama | |
| 6,968,037 B2 * | 11/2005 | Rosso et al. | 378/79 |
| 6,984,334 B2 | 1/2006 | Suzuki | |
| 6,989,060 B2 | 1/2006 | Kuwabara | |
| 7,083,678 B2 | 8/2006 | Hawtof et al. | |
| 7,311,773 B2 * | 12/2007 | Sanjoh | 117/68 |
| 2003/0152194 A1 * | 8/2003 | Nordmeyer et al. | 378/73 |
| 2004/0197599 A1 | 10/2004 | Higuchi et al. | |
| 2004/0255842 A1 | 12/2004 | Kajigaya et al. | |
| 2005/0139342 A1 * | 6/2005 | Boulet | 164/317 |
| 2005/0145165 A1 | 7/2005 | Kajigaya et al. | |
| 2005/0163280 A1 * | 7/2005 | Nordmeyer et al. | 378/71 |
| 2008/0134962 A1 * | 6/2008 | Oyama et al. | 117/200 |
| 2009/0205563 A1 * | 8/2009 | Arena et al. | 117/102 |
| 2009/0277223 A1 * | 11/2009 | Kayser et al. | 65/33.9 |

FOREIGN PATENT DOCUMENTS

| | | |
|---|---|---|
| JP | 5460300 A | 5/1979 |
| JP | 401096095 | 4/1989 |
| JP | 11-228292 | 8/1999 |
| JP | 2004-091307 | 3/2004 |

* cited by examiner

CRYSTALLIZATION METHOD AND CRYSTALLIZATION APPARATUS

CROSS-REFERENCE TO RELATED APPLICATIONS

This application is a continuation of U.S. patent application Ser. No. 11/098,959 filed Apr. 4, 2005 now abandoned to which priority under 35 U.S.C. §120 is claimed, which again claims priority to Japanese Patent Application No. 2004-110836 filed on Apr. 5, 2004 under 35 U.S.C. §119, the entirety of all of which are incorporated herein by reference as if fully set forth herein.

BACKGROUND OF THE INVENTION

The present invention relates mainly to a method and apparatus that grows a crystal by a solidification process that solidifies melted crystal material.

Various existing methods to produce an excellent single crystal by controlling a solidification process that solidifies melted crystal material are conventional used for manufacture various crystal materials.

Typical manufacturing method for the single crystal is the CZ (Czochralski) method that slowly lifts a solid crystal from solidifying melted material in a crucible and the Bridgman method that is solidifies the melted material in one direction by changing a temperature distribution in the crucible that houses the melted material. The choice of single crystal manufacturing method depends on required characteristics and performance from the manufactured single crystal.

The single crystal manufactured by the above crystallization method is, generally, high-purity. Moreover, it is high demand for the single crystal not to include defects such as air bubbles. Then, the crystal is grown at a slow crystal growth rate by using a melt liquid consisting of an enough high-purity crystal material so that the impurities and air bubbles are not included in the manufactured single crystal.

More particularly, when calcium fluoride is used as an optical element for ultraviolet etc. with short wavelength, an optical performance is greatly deteriorated because of extremely small amount of impurities, so a scavenger to remove impurities is added to the melt liquid during the crystal growth process, and high-purity single crystal is manufactured. For instance, refer to "Single Crystal Growth Technology (Tsuguo Fukuda, Keigo Hoshikawa., BAIFU-KAN CO., LTD)".

However, in actual crystal growth process, impurities and air bubbles that mix into the grown single crystal cannot always be completely removed. This is because impurities remain such as the solid crystal material before melt, gas molecules that adhere to the crucible surface, and adhered particles of high melting point that can not desorbed from the melt liquid when viscosity is comparatively high.

Moreover, it is necessary to remove a reaction product to outside of system by adding a high-purity scavenger as a gas for the above calcium fluoride. However, all the gas cannot be exhausted, and remains in the grown crystal for the above reasons.

The present invention is invented to solve the above problem, and provides crystallization method and crystallization apparatus that efficiently removes gas and solid particles of high melting point that exist in a melt liquid during the crystal growth process to outside of system, and grows high-purity crystal that does not include air bubbles.

SUMMARY OF THE INVENTION

In order to achieve the above object, a crystallization method according to one aspect of the present invention that includes the steps of melting a crystallized material in a crucible by heating; and growing a crystal by cooling and coagulating the melted material, wherein said melting step includes introducing a predetermined gas into the melted material.

An optical element according to another aspect of the present invention made of a single crystal, said single crystal being manufactured by a crystallization method that includes melting a crystallized material in a crucible by heating, and growing a crystal by cooling and coagulating the melted material, wherein said melting step includes introducing a predetermined gas into the melted material, and wherein said crystallized material is a calcium fluoride with an added scavenger, and the gas introduced into the melted fluorite is an inert gas.

An exposure apparatus according to another aspect of the present invention includes a light source, an illumination optical system for guiding a light from the light source to a reticle, and a projection optical system for guiding the light from the reticle to a wafer that is placed on a wafer stage, wherein said illumination optical system or the projection optical system includes an optical element, and wherein said optical element is made of a single crystal, said single crystal being manufactured by a crystallization method that includes, melting a crystallized material in a crucible by heating, and growing a crystal by cooling and coagulating the melted material, wherein said melting step includes introducing a predetermined gas into the melted material, and wherein said crystallized material is a calcium fluoride with an added scavenger, and the gas introduced into the melted calcium fluoride is an inert gas.

A crystallization apparatus according to another aspect of the present invention includes a crucible arranged in a predetermined temperature distribution, which houses a melted crystallized material, and a gas introducing part for introducing a gas into the melted crystallized material, wherein the crystallization apparatus coagulates the melted crystallized material in one direction by changing the temperature distribution relatively to the crucible.

A crystallization apparatus according to another aspect of the present invention includes a crucible heated at a predetermined temperature, and houses a melted crystallized material, and a gas introducing part for introducing a gas into the melted crystallized material, wherein the crystallization apparatus grows a crystal by lifting a member in contact with the melted crystallized material.

The present invention can produce a crystal with low concentration of impurities and does not include air bubbles etc. by introducing a gas into a melt liquid used for the crystal growth and shaking.

DETAILED DESCRIPTION OF PREFERRED EMBODIMENTS

Figure 1:
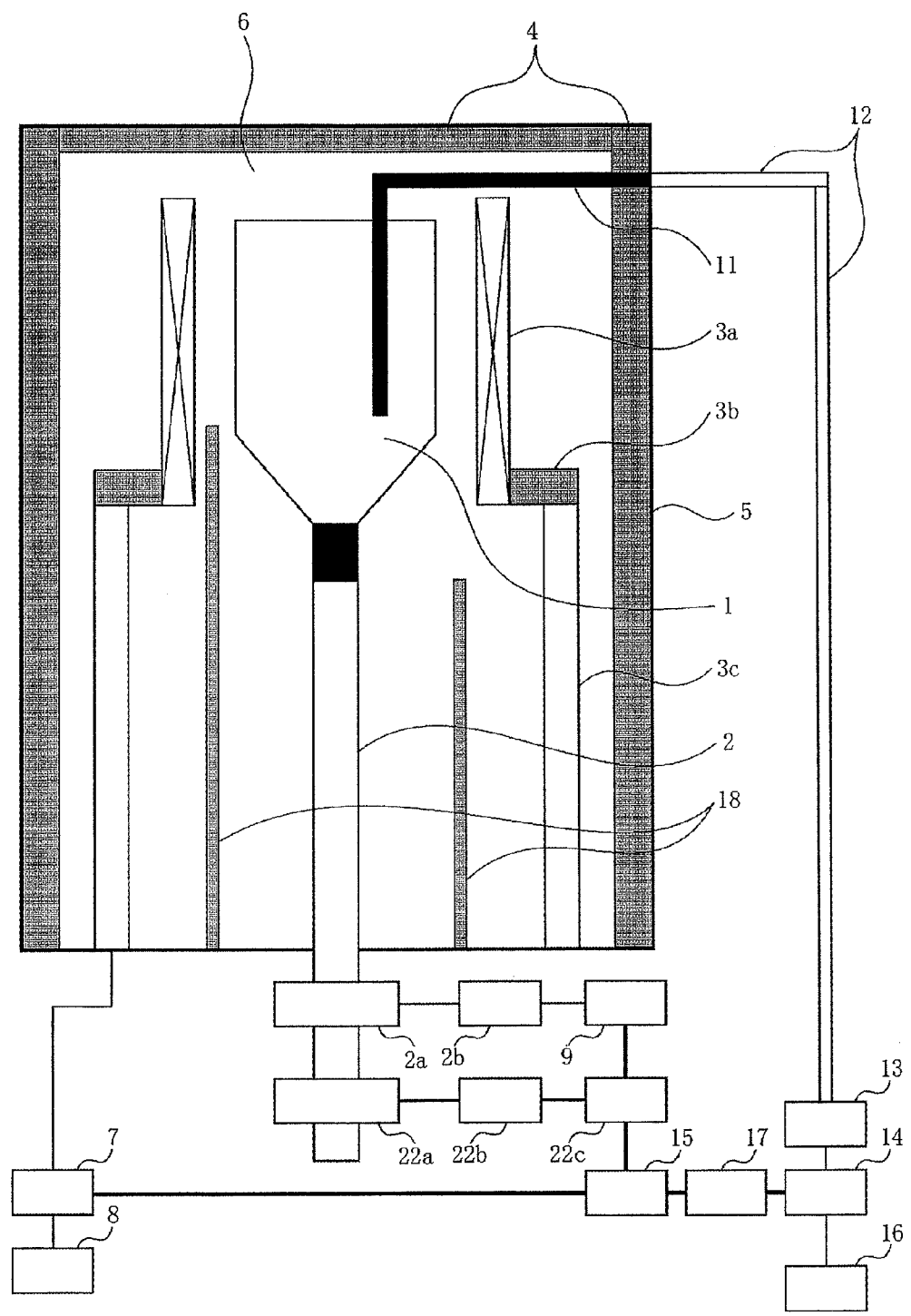
FIG. 1 is a typical sectional view of a crystallization apparatus according to the present invention.

FIG. 1 is a typical sectional view of a crystallization apparatus according to the present invention. In FIG. 1, a side heater 3a made of graphitized carbon with cylindrical form is arranged in a housing 5 that forms a chamber 6. The side heater 3a is supplied an electric power from a side heater power source 7 that is controlled by a controller 9, and forms a predetermined temperature distribution in the chamber 6. The temperature of the chamber 6 is measured by the temperature sensor 18, and feedback to the controller 9. An insulator 4 made of graphitized carbon is installed inside the housing 5, and protects the housing 5 from the high-temperature. The chamber 6 is vacuum exhausted to the pressure of 1E-4 or less (Torr) by the exhaust apparatus (not shown).

A crucible support rod 2 that supports a crucible 1 is installed to penetrate through a bottom part of the housing 5. The crucible 1 houses a material as a crystalloid. A crucible lifting motor 2a drives the crucible support rod 2 in a vertical direction at a predetermined speed by an electric power from a crucible lifting motor power source 2b that is controlled by the controller 9. A bottom part of the chamber 6 is maintained at the temperature below a melting point of the grown crystal. The crystal coagulates from an upper side in the crucible 1 in one direction, and grows by lowering down the crucible 1 by the crucible support rod 2.

The crystallization apparatus according to the present invention further includes a gas introducing port 11 that introduces a gas into the crucible 1. The gas introducing port 11 is supplied a predetermined gas from a gas tank 16 through a gas valve 14, a valve controller 17, a gas purification apparatus 13, and a pipe 12 etc. The gas introducing port 11 has a movable (up and down) structure to insert into the melt liquid in the crucible 1 to introduce the gas after the material as the crystalloid is melted, and to shelter it from the crucible 1 during the crystal growth. The gas introducing port 11 is made of a same material as crucible 1 so as not to pollute the melt liquid.

Figure 2:
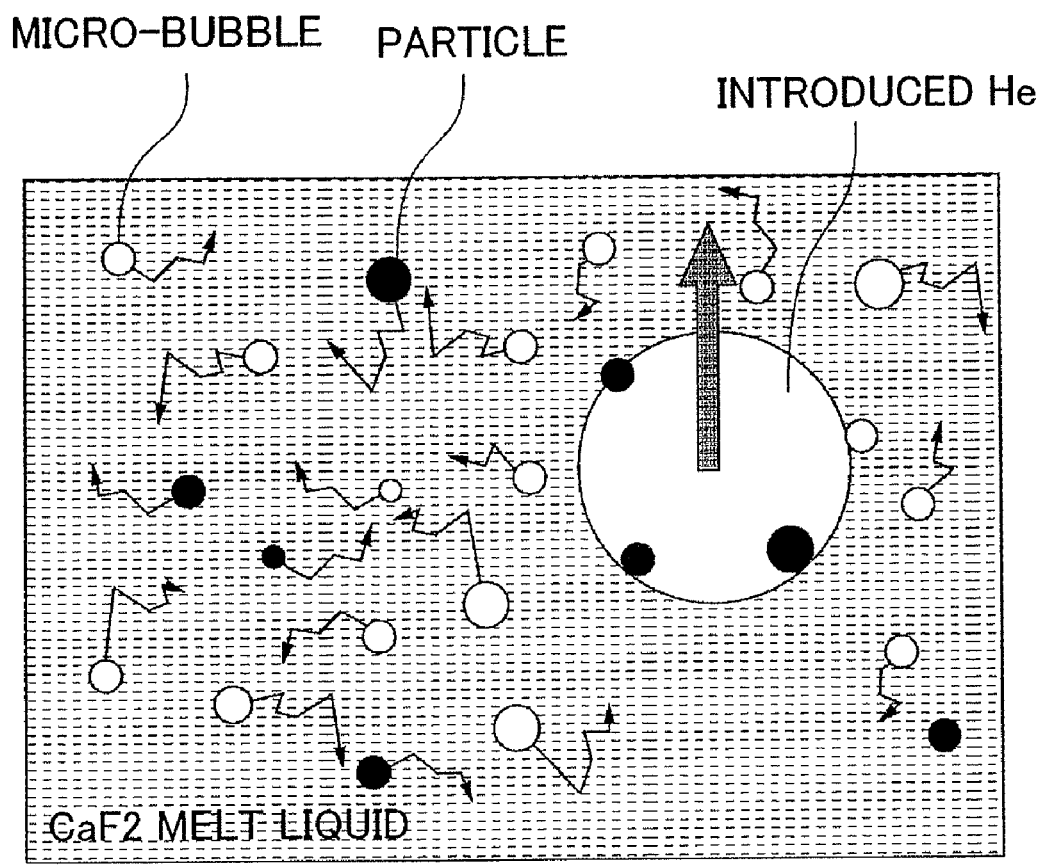
FIG. 2 is typical view of state that particles and gas impurities in a melt liquid are removed by introducing a gas.

FIG. 2 is typical view of state that particles and gas impurities in the melt liquid are removed by introducing the gas. FIG. 2 shows the case where helium is introduced into the calcium fluoride, but the present invention is not limited to this. For instance, generally, the effect of the present invention can be achieved by introducing the gas into the melt liquid used for the crystal growth.

When the air bubbles and particle exist in the melt liquid, the buoyancy F that acts on the air bubbles etc. is shown by a reaction formula (1).

$$F=(\rho-\rho')gV \quad (1)$$

Here, $\rho$ is a density of the melt liquid, $\rho'$ is a density of the air bubbles etc., g is a gravitational acceleration, and V is a volume of the air bubbles. When the air bubbles exists in the melt liquid, generally, $\rho'$ can be disregarded for $\rho$ because the density of the air bubbles is small enough compared with the density of the melt liquid.

Originally, the air bubbles existed at the melt liquid surface, and is exhausted to the outside of the system. Because the buoyancy is proportional to the volume of the air bubbles as understood from the reaction formula (1), the buoyancy is much smaller for air bubbles that have a diameter of plural tens μm or less (micro-bubble) which causes problems during crystal growth. Therefore, the air bubble cannot surface, and is present in the grown crystal. Especially, when the density of the air bubbles included in the melt liquid is below constancy by a constant management, there is little thing to which the bubble's uniting increases the volume, and the air bubbles of a certain amount remains even if it dissolves for a long time.

Moreover, when the air bubbles etc. that exist in the melt liquid reacts with the melt liquid, a secondary reaction is caused because the air bubbles exist in the melt liquid for a long time and becomes impurities in the melt liquid.

As shown in FIG. 2, the micro-bubbles that cannot surface in the melt liquid can be effectively exhausted to the outside of the system by introducing the predetermined gas as a bubble that has a diameter more than certainly into the melt liquid. In other words, when an enough big bubbles surface in the melt liquid, it is possible to exhaust the air bubbles to the outside of the system by catching the micro-bubbles. When a minute particle as solid exists in the melt liquid, the particle is taken into the bubble by a surface tension between the particle and the melt liquid, and can be exhausted to the outside of the system. The particle carried to the surface of the melt liquid once by the bubble does not mix again into the melt liquid by the surface tension.

It is desirable that the gas introduced into the melt liquid does not become a harmful impurity in the melt liquid, and is promptly exhausted to outside of the melt liquid. As explained by the following embodiments, an inert gas that does not generate impurities is desirable for the melt liquid of the calcium fluoride, and helium is more desirable because the density is low and the diffusion speed is high in the melt liquid. On the other hand, it is desirable for the melt liquid of the oxide crystal such as niobic acid lithium and the tantalic acid lithium etc. to introduce oxygen for the maintenance of stoichiometry. The acceptable inert gas is similar to the calcium fluoride, and helium is more desirable because the density is low and the diffusion speed is high in the melt liquid.

The gas introduced is of a high purity to not introduce impurities along with the introduction of the gas.

First Embodiment

The instant embodiment explains an example of manufacturing the calcium fluoride chiefly used for an optical material by the above crystallization method.

A material that adds $ZnF_2$ of 0.1% by weight as the scavenger to high-purity calcium fluoride polycrystal which is a material of calcium fluoride single crystal is placed into the carbon crucible 1 shown in FIG. 1. After the chamber 6 is vacuum-exhausted, the side heater 3 is electrified to heat the chamber 6, the crucible 1 is adjusted to about 1360° C., and the material in the crucible 1 is melted. The melt state is maintained for about three hours for the oxygen removal reaction to occur in the melt liquid by the scavenger, and then, the gas introducing port 11 made of carbon is inserted in the crucible 1, and the state is maintained for seven hours while introducing the helium gas with 300 sccm. Meanwhile, the chamber 6 is maintained to the pressure of 1 Torr or less to easily deaerate the introduced helium gas.

Then, the introduction of the helium gas is ended, and the gas introducing port 11 is taken out of the crucible 1, and the melt state is maintained for about two hours to deaerate the introduced helium gas. After the vacuum level of the chamber 6 is 2E-6 Torr or more, the crucible 1 is descended at the speed of 1 mm/h so as to grow the calcium fluoride single crystal.

Table 1 shows a residual concentration of Zn (analyzed with ICP) and density of the micro-bubbles that has diameter of 30 μm or less (number for each 1 liter crystal) of the calcium fluoride crystal grown by the instant embodiment. Table 1 shows a residual concentration of Zn and density of micro-bubbles of a calcium fluoride crystal that occur in the crystal after the melt state is maintained for twelve hours without introducing the helium gas for the comparison.

TABLE 1

|  | CALCIUM FLUORIDE OF THE INSTANT EMBODIMENT | COMPARISON EXAMPLE |
| --- | --- | --- |
| RESIDUAL CONCENTRATION OF Zn (ppb) | 5 | 57 |
| DENSITY OF MICRO-BUBBLE (number/L) | 3.1 | 32.7 |

Reference to Table 1, the residual concentration of Zn and density of micro-bubbles have decreased when the helium gas is introduced (the instant embodiment). It is thought that this depends on the following actions:

The decrease in the residual concentration of Zn by the introduction of the helium gas is thought to be a result of the removal by the evaporation of the zinc included in the added scavenger by the gas introduction. The added $ZnF_2$ as the scavenger removes oxygen in the melt liquid of calcium fluoride by the reaction shown in the following a reaction formulas (2) and (3).

$$CaO + ZnF_2 \rightarrow CaF_2 + ZnO \qquad (2)$$

$$ZnO + C(crucible\ etc.) \rightarrow Zn\uparrow + CO\uparrow \qquad (3)$$

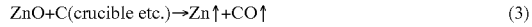

As shown in the reaction formula 3, the metallic zinc generated by the reaction with the scavenger evaporates and is excluded from the melt liquid because the vapor pressure is high. However, the concentration of zinc is actually low, and the bubble of size that obtains the enough buoyancy to desorb from the melt liquid can not be formed. Therefore, the desorption from the melt liquid is limited to the desorption from the melt liquid surface.

On the other hand, when the helium gas is introduced (the instant embodiment), the micro-bubble of the zinc (or vacuole) that exists in the melt liquid contacts the helium gas, is taken into the helium gas as vapor, and is exhausted to the outside of the melt liquid.

The decrease in the micro-bubbles by the introduction of the helium gas is understood as follows: The generation cause of the micro-bubble is not clear. However, it is thought that the micro-bubble is caused by the gas's that exist in the melt liquid, and the micro-bubble is caused by the crystal growth's being locally obstructed.

For instance, CO etc. generated by the reaction with the scavenger do not have the enough buoyancy to desorb from the melt liquid because they are generated as the micro-bubble in the melt liquid, and is taken into the grown crystal easily. CO that exists in the melt liquid for a long time as the micro-bubbles generates a minute amount of solid carbon by heat-resolving, and causes the micro-bubble of the crystal being present in the crystal.

On the other hand, when the helium gas is introduced (the instant embodiment), the micro-bubble that exists in the melt liquid contacts the helium gas, is taken into the helium gas as vapor, and is exhausted to the outside of the melt liquid. When remaining as the air bubbles in the melt liquid for certain time after mixing with the helium gas, a reactive speed with the melt liquid etc. decreases due to the decrease in the partial pressure due to the mixing, and a generation of a secondary particles and a mixing of impurities can be prevented.

Moreover, a particle that mixes from a refractory material such as crucible etc. is exhausted to the melt liquid surface by introducing the helium gas. It is thought that the amount of micro-bubbles in the grown crystal decreases by these effects.

Figure 3:
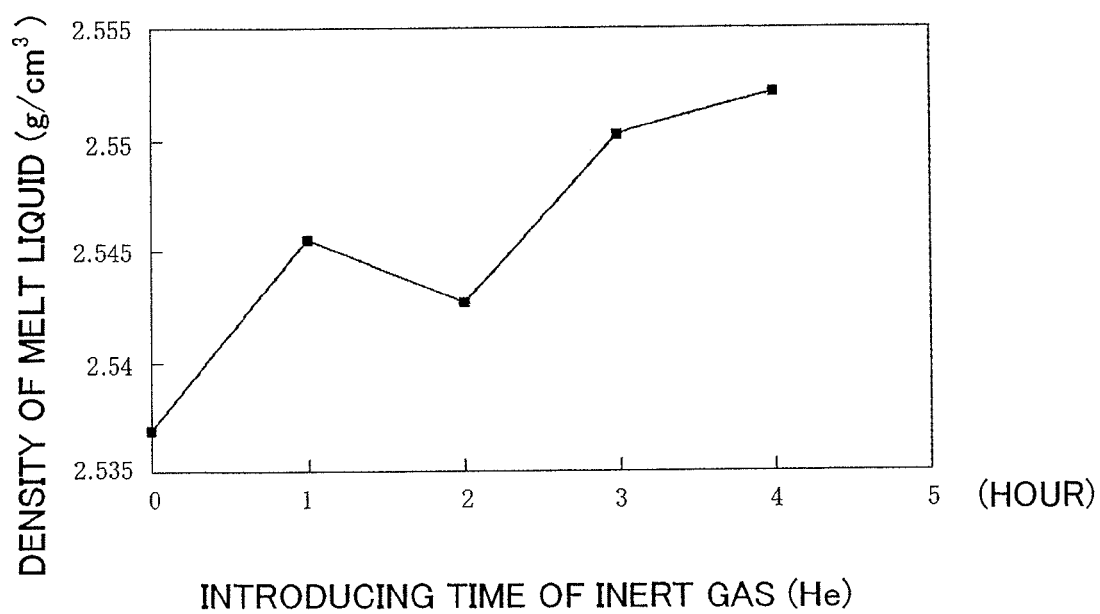
FIG. 3 is a view of a relationship between an introducing time that helium gas is introduced into a melt liquid of calcium fluoride before the crystal growth begins and a density of melt liquid.

FIG. 3 is a view of a relationship between an introducing time that helium gas is introduced into the melt liquid of calcium fluoride before the crystal growth and the density of the melt liquid. The density is measured by Archimedes method that uses a gauge head made of the carbon at the melting point of 1360° C. The density of the melt liquid increases as the introducing time of the gas becomes long. The cause of the density changing of the melt liquid shown in FIG. 3 is not clear. However, it is thought that it is the result of the promotion of the exhaust of the air bubbles that exist in the melt liquid.

Figure 4:
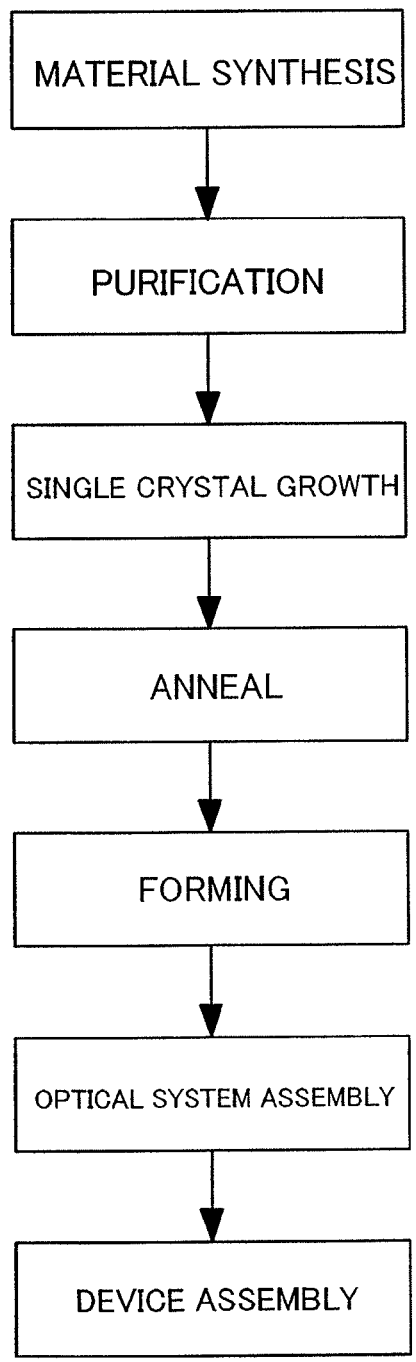
FIG. 4 is a flowchart that shows a process flow from a material synthesis of calcium fluoride single crystal that grows in the present invention to an exposure apparatus.

FIG. 4 is a flowchart that shows a process flow from a synthesis of material of calcium fluoride single crystal that grows in the present invention to a device assembly.

A high-purity calcium fluoride polycrystal above, used as material of calcium fluoride single crystal, is synthesized by the following processes. First, a calcium carbonate and a hydrogen fluoride are made to react as in a reaction formula (4), and a powdery calcium fluoride is synthesized.

$$CaCO_3 + 2HF \rightarrow CaF_2 + H_2O + CO_2 \qquad (4)$$

In the purification process that bakes the calcium fluoride generated by the reaction formula (4), the baked calcium fluoride mixes with the scavenger, and melts in the carbon crucible, for example, the oxygen contained in the calcium fluoride as a burnt lime is removed as shown in reaction formula (5).

$$CaO + ZnF_2 \rightarrow CaF_2 + ZnO\uparrow \qquad (5)$$

The scavenger preferably includes zinc fluoride, bismuth fluoride, sodium fluoride, lithium fluoride, and others which are more easily combinable with oxygen mixed in the calcium fluoride than the calcium fluoride, and easily decomposes and evaporates. The zinc fluoride is preferable. In the purification process, the scavenger is added by 0.05 mol % to 5.0 mol %, desirably 0.1 mol % to 1.0 mol %. The calcium fluoride polycrystal obtained thus is used to manufacture the calcium fluoride single crystal.

The instant embodiment explained the gas introduction in the growth process of the calcium fluoride crystal, but even if the gas is introduced in the above purification process, a similar effect can be achieved. Therefore, the purity of the material used for the crystal growth is improved. Moreover, it is applicable when scavengers other than the zinc fluoride are used.

In addition, the present invention is not limited to manufacturing the calcium fluoride crystal. When the material in the crucible is coagulated in one direction and the crystal is manufactured, the present invention can be applied.

Heat treatment processing is performed on the grown calcium fluoride single crystal in an anneal chamber. This process heats the calcium fluoride single crystal to 900° C. to 1300° C. in the crucible. The heating time is 20 hours or more, desirably 20 hours to 30 hours, and then the calcium fluoride single crystal is cooled at cooling speed of about 1° C./hour. Then, the calcium fluoride single crystal is formed into a shape of a prescribed optical element, and used for an optical system.

Figure 5:
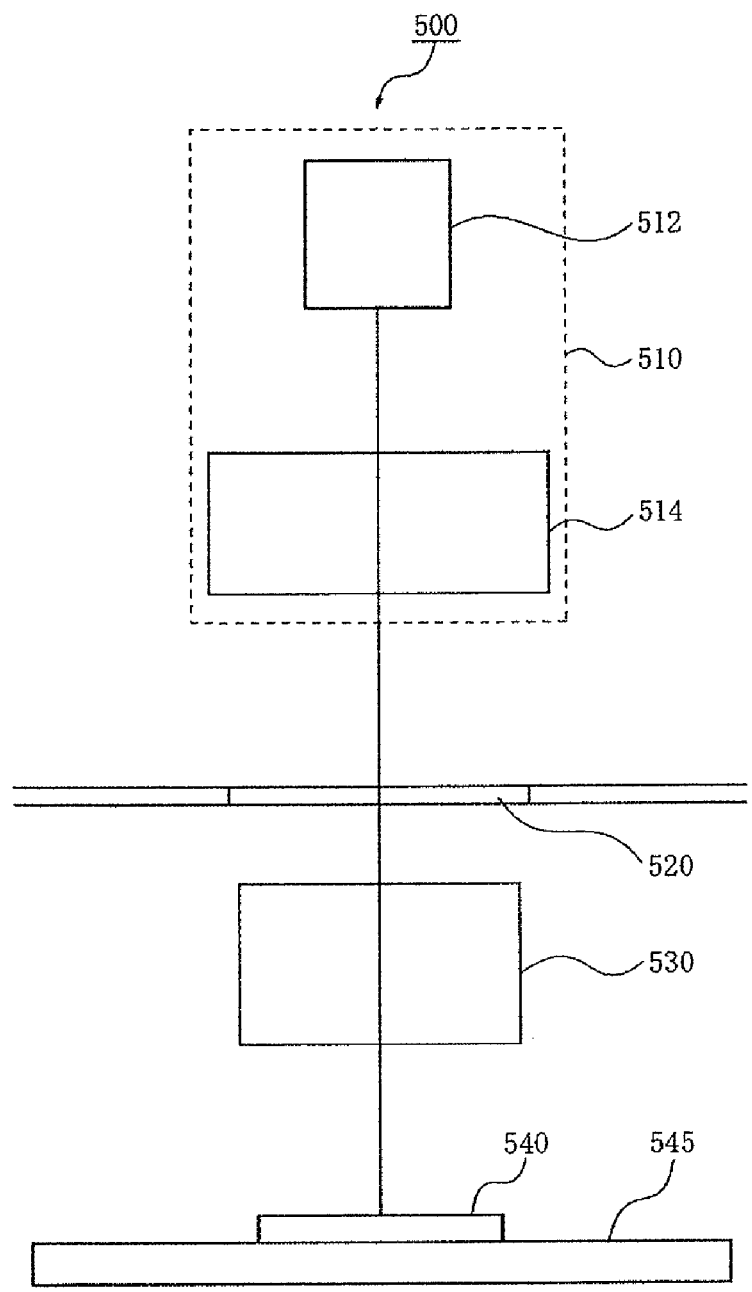
FIG. 5 is schematic sectional view of an exposure apparatus using the calcium fluoride single crystal grown by the present invention.

FIG. 5 is schematic sectional view of an exposure apparatus using the calcium fluoride single crystal grown by the present invention. Referring now to FIG. 5, a description will be given of the exposure apparatus 500. The exposure apparatus 500 includes, as shown in FIG. 5, an illumination apparatus 510 for illuminating a reticle 520 which forms a circuit pattern, a projection optical system 530 that projects diffracted light created from the illuminated reticle pattern onto a plate 540, and a stage 545 for supporting the plate 540.

The exposure apparatus 500 is a projection exposure apparatus that exposes onto the plate 540 a circuit pattern created on the reticle 520, e.g., in a step-and-repeat or a step-and-scan manner. Such an exposure apparatus is suitable for a sub-micron or quarter-micron lithography process. This embodiment exemplarily describes as a step-and-scan exposure apparatus (which is also called "a scanner"). The "step-and-scan manner", as used herein, is an exposure method that exposes a reticle pattern onto a wafer by continuously scanning the wafer relative to the reticle, and by moving, after an exposure shot, the wafer stepwise to the next exposure area to be shot. The "step-and-repeat manner" is another mode of exposure method that moves a wafer stepwise to an exposure area for the next shot, for every cell projection shot.

The illumination apparatus 510 which illuminates the reticle 520 that forms a circuit pattern to be transferred, includes a light source unit 512 and an illumination optical system 514.

As an example, the light source unit 512 uses a light source such as ArF excimer laser with a wavelength of approximately 193 [nm] and KrF excimer laser with a wavelength of approximately 248 [nm]. However, the laser type is not limited to excimer lasers because for example, $F_2$ laser with a wavelength of approximately 157 [nm] and a YAG laser may be used. Similarly, the number of laser units is not limited. For example, two independently acting solid lasers would cause no coherence between these solid lasers and significantly reduces speckles resulting from the coherence. An optical system for reducing speckles may swing linearly or rotationally. When the light source unit 512 uses laser, it is desirable to employ a beam shaping optical system that shapes a parallel beam from a laser source to a desired beam shape, and an incoherently turning optical system that turns a coherent laser beam into an incoherent one. A light source applicable for the light source unit 512 is not limited to a laser, and may use one or more lamps such as a mercury lamp and a xenon lamp.

The illumination optical system 514 is an optical system that illuminates the reticle 520, and includes a lens, a mirror, a light integrator, a stop, and the like, for example, a condenser lens, a fly-eye lens, an aperture stop, a condenser lens, a slit, and an image-forming optical system in this order. The illumination optical system 514 can use any light regardless of whether it is axial or non-axial light. The light integrator may include a fly-eye lens or an integrator formed by stacking two sets of cylindrical lens array plates (or lenticular lenses), and can be replaced with an optical rod or a diffractive element. The inventive calcium fluoride crystal is applicable to optical elements, such as, a lens in the illumination optical system 514.

The reticle 520 is made, for example, of quartz, forms a circuit pattern (or an image) to be transferred, and is supported and driven by a mask stage (not shown). Diffracted light emitted from the reticle 520 passes through the projection optical system 530 and is then projected onto the plate 540. The reticle 520 and the plate 540 are located in an optically conjugate relationship. Since the exposure apparatus 500 of this embodiment is a scanner, the reticle 520 and the plate 540 are scanned at the speed ratio of the reduction ratio of the projection optical system 530, thus transferring the pattern from the reticle 520 to the plate 540. If it is a step-and-repeat exposure apparatus (referred to as a "stepper"), the reticle 520 and the plate 540 remains still when exposing the mask pattern.

The projection optical system 530 is an optical system that projects light that reflects a pattern on the reticle 520 located on an object surface onto the plate 540 located on an image surface. The projection optical system 530 may use an optical system comprising solely of a plurality of lens elements, an optical system including a plurality of lens elements and at least one concave mirror (a catadioptric optical system), an optical system including a plurality of lens elements and at least one diffractive optical element such as a kinoform, a full mirror type optical system, and so on. Any necessary correction of the chromatic aberration may be accomplished by using a plurality of lens units made from glass materials having different dispersion values (Abbe values) or arranging a diffractive optical element such that it disperses light in a direction opposite to that of the lens unit. An optical element made of the inventive calcium fluoride crystal is applicable to any optical element, such as a lens in the projection optical system 530.

The plate 540, such as a wafer and a LCD, is an exemplary object to be exposed. Photoresist is applied to the plate 540. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process to enhance the adhesion between the photoresist and a base (i.e., a process to increase the hydrophobicity by applying a surface active agent), through a coat or vaporous process using an organic coating such as HMDS (Hexamethyl-disilazane). The pre-bake treatment is a baking (or burning) step, which makes the photoresist softer than after development and removes the solvent.

The stage 545 supports the plate 540. The stage 545 may use any structure known in the art, thus, a detailed description of its structure and operation is omitted. The stage 545 may use, for example, a linear motor to move the plate 540 in the XY directions. The reticle 520 and plate 540 are, for example, scanned synchronously, and the positions of the stage 545 and a mask stage (not shown) are monitored, for example, by a laser interferometer and the like, so that both are driven at a constant speed ratio. The stage 545 is installed on a stage stool supported on the floor and the like, for example, via a dampener. The mask stage and the projection optical system 530 are installed on a lens barrel stool (not shown) support, for example, via a dampener, to the base frame placed on the floor.

In exposure, light is emitted from the light source 512, e.g., Koehler-illuminates the reticle 520 via the illumination optical system 514. Light that passes through the reticle 520 and reflects the mask pattern is imaged onto the plate 540 by the projection optical system 530. The illumination and projection optical systems 514 and 530 in the exposure apparatus 500 include an optical element made of inventive calcium fluoride crystal that transmits the UV light, FUV light, and VUV light with high transmittance, and provide high-quality devices (such as semiconductor devices, LCD devices, photographing devices (such as CCDs, etc.), thin film magnetic heads, and the like) with high throughput and economic efficiency.

Figure 6:
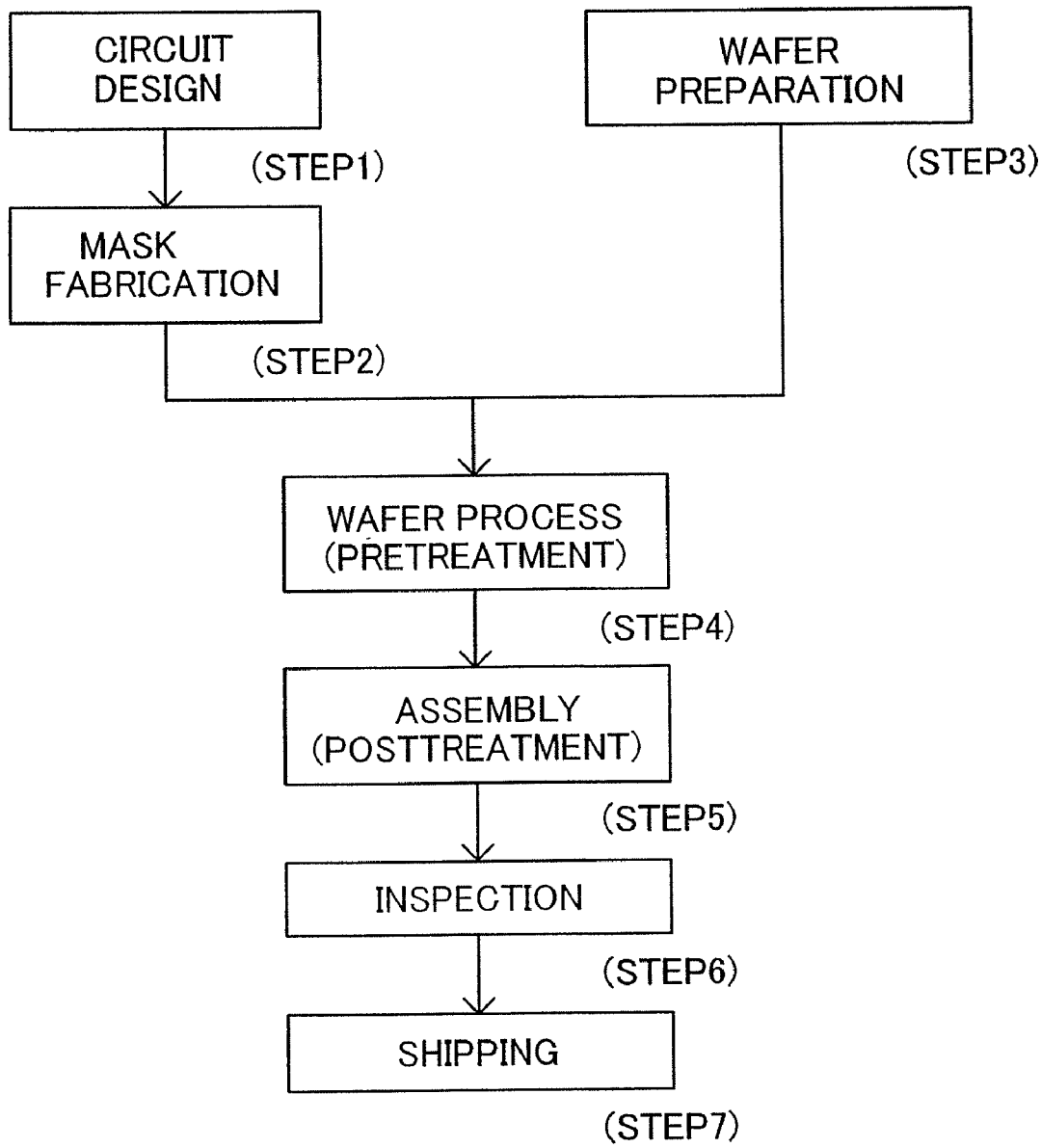
FIG. 6 is a flowchart for explaining how to fabricate devices (such as semiconductor chips such as ICs, LCDs, CCDs, and the like).
Figure 7:
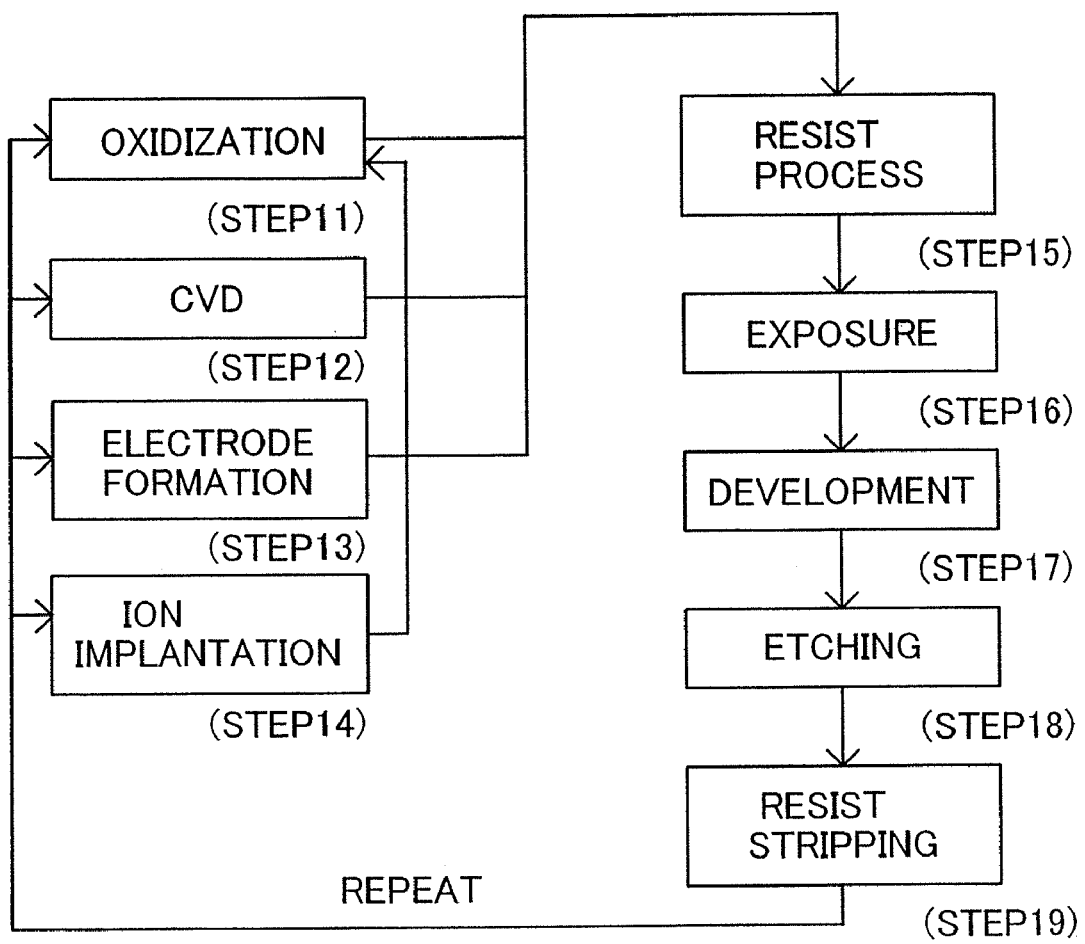
FIG. 7 is a detailed flowchart of a wafer process in Step 4 of FIG. 6.

Referring now to FIGS. 6 and 7, a description will be given of an embodiment of a device fabrication method using the above mentioned exposure apparatus 500. FIG. 6 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 7 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 500 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. Use of the fabrication method in this embodiment helps fabricate higher-quality devices than conventional methods. Thus, the device fabrication method using the exposure apparatus 500, and resultant devices constitute one aspect of the present invention.

Second Embodiment

Figure 8:
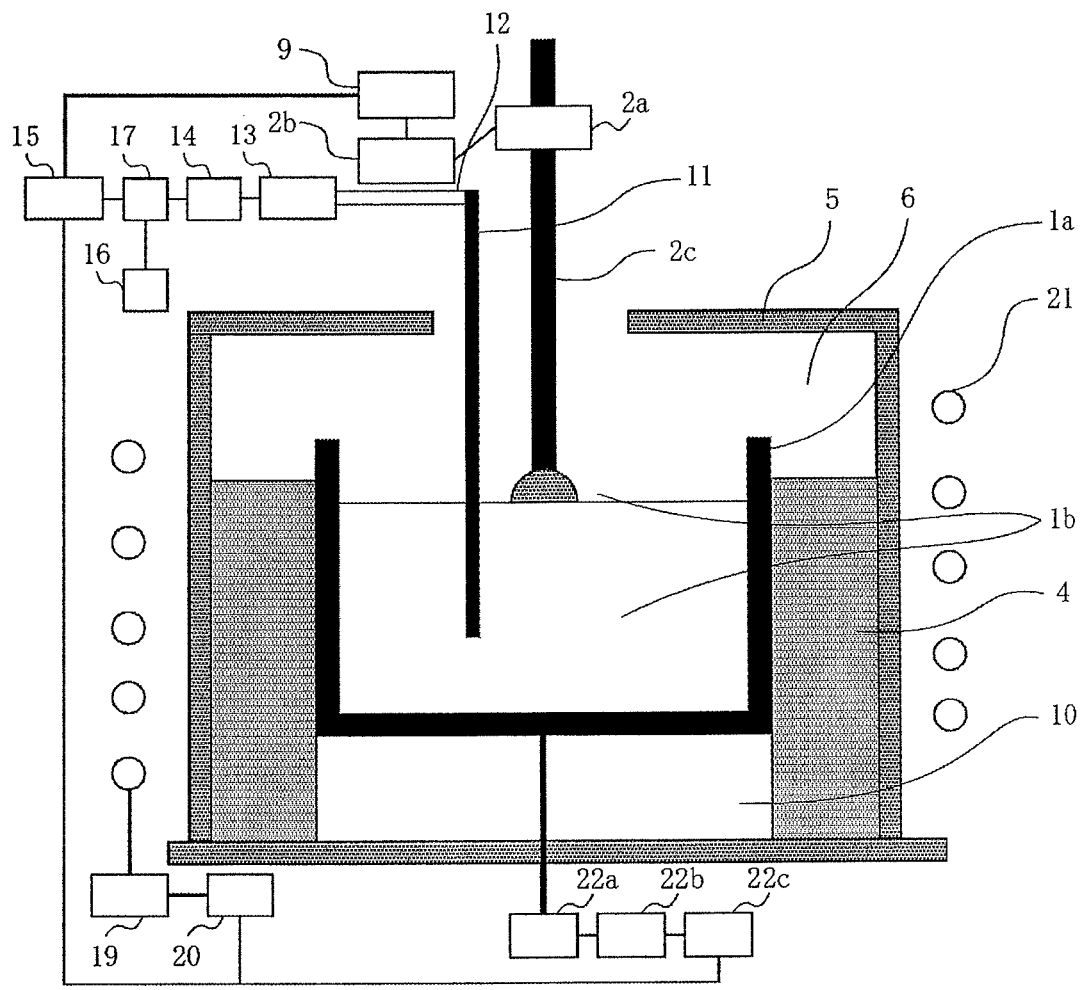
FIG. 8 is a typical sectional view of a second crystallization apparatus according to the present invention.

FIG. 8 is a typical sectional view of a second crystallization apparatus according to the present invention. FIG. 8 shows a structure when this invention is executed with the crystallization apparatus by Czochralski method. In the instant embodiment, a description will be given of manufacturing of lithium tantalate ($LiTaO_3$) (hereafter, LT) crystal as one example of the grown crystal.

In FIG. 8, a crucible 1 a that houses a melting material as a crystalloid is installed in the housing 5 that form the chamber 6. An insulator 4 is installed inside the housing 5, and protects the housing 5 from the high-temperature. The chamber 6 is vacuum exhausted to the pressure of 1E-4 or less (Torr) by the exhaust apparatus (not shown).

A RF (radiofrequency generation) coil 21 that heats the material in the crucible 1a is arranged outside of the chamber 6. The RF coil 21 is supplied an electric power from a radiofrequency generation power source 20 that is controlled by a power source controller 19. The crucible 1a is made of platinum, and an induction heating is possible by an induced current caused by the RF coil 21.

A material support rod 2c that fixes a seed crystal to an edge is installed in an upper part of the crucible 1a. A support rod lifting motor 2a is supplied the electric power from a support rod power source 2b that is controlled by the controller 9, and drives the material support rod 2c.

The crystallization apparatus according to the present invention further includes the gas introducing port 11 that introduces the gas in the crucible 1a. The gas introducing port 11 is supplied a predetermined gas from the gas tank 16 through the gas valve 14, the valve controller 17, the gas purification apparatus 13, and the pipe 12 etc. The gas introducing port 11 has a movable (up and down) structure to insert into the melt liquid in the crucible 1a to introduce the gas after the crystalloid material is melted, and to shelter from the crucible 1a during the crystal growth. The gas introducing port 11 is made of a same material as the crucible 1a so as not to pollute the melt liquid.

Powdery lithium tantalate (LT) is put in the crucible 1a, the chamber 6 is vacuum-exhausted, and the crucible 1a is heated up to 1670° C. of the melting point, and the material in the crucible 1a is melted. Then, the vacuum exhaust is stopped, and the chamber 6 is returned to the atmospheric pressure by inserting the gas introducing port 11 in the crucible 1a, and introducing oxygen at the rate of 200 sccm. In addition, oxygen is introduced for three hours while the chamber 6 maintained to the atmospheric pressure.

Then, the atmospheric pressure is maintained for one hour after the introduction of oxygen is stopped, the material support rod 2c that fixes the seed crystal to the edge is moved so that the seed crystal contacts the melt liquid, and the crystal growth is begun. The crystal growth is done while lifting the material support rod 2c at speed of 1 mm/h and rotating the material support rod 2c at 40 rpm.

Table 2 shows a transmittance (wavelength: 300 nm) and a density of micro-bubbles of the lithium tantalate crystal obtained by the instant embodiment, that compared with a lithium tantalate crystal grown under other conditions. The comparison examples are an example of introducing the helium gas instead of oxygen and an example of growing the crystal without introducing gas under the oxygen atmosphere.

TABLE 2

| | TRANSMITTANCE (%) | DENSITY OF MICRO-BUBBLE (piece/L) |
|---|---|---|
| LT CRYSTAL OF THE INSTANT EMBODIMENT | 65 | 5.2 |
| LT CRYSTAL INTRODUCED He | 52 | 6.7 |
| LT CRYSTAL WITHOUT INTRODUCING GAS | 45 | 27.8 |

Reference to Table 2, the transmittance has improved and the density of micro-bubbles has decreased when the oxygen is introduced (the instant embodiment). On the other hand, when the helium gas is introduced, the transmittance is not improved enough even though the decrease in the density of the micro-bubbles is achieved. When the helium gas is introduced, a part of the oxygen in the crystal material melts into the melt liquid, and the oxygen defect is taken into the grown crystal even though the gas is removed.

The instant embodiment explains the crystal growth of the lithium tantalate crystal, but the same effect can be achieved with the lithium niobic acid crystal that has a same structure.

The lithium tantalate crystal and the lithium niobic acid crystal manufactured by the above method has a composition near a stoichiometric composition has excellent transmittance, and therefore, can be used as a wavelength sensing element, an optical modulator, an optical switch element, and a digital hologram memory element besides for just a laser medium.

What is claimed is:

1. A calcium fluoride crystallization apparatus comprising:
    a chamber;
    an exhaust apparatus equipped to vacuum exhaust the chamber;
    a crucible in the chamber for melting a crystal material;
    a movable gas introducing part comprising a gas introducing port equipped to introduce helium gas into the crucible; and
    a movable structure equipped to move the gas introducing part between a first position in which the gas introducing port is located outside an interior cavity of the crucible during growth of the crystal material in the crucible, and a second position in which the gas introducing port is located inside the interior cavity of the crucible and adjacent to, but not touching a bottom wall of the crucible, when melting of the crystal material in the crucible has occurred,
    wherein the gas introducing part is made of the same material as the crucible, and
    wherein the gas introducing part and the crucible are made of carbon.

2. A calcium fluoride single crystallization apparatus comprising:
    a chamber;
    an exhaust apparatus equipped to vacuum exhaust the chamber;
    a crucible in the chamber for melting a calcium fluoride polycrystal material;
    a movable gas introducing part comprising a gas introducing port equipped to introduce helium gas into the crucible; and
    a movable structure equipped to move the gas introducing part between a first position in which the gas introducing port is located outside an interior cavity of the crucible during growth of the crystal material in the crucible, and a second position in which the gas introducing port is located inside the interior cavity of the crucible and adjacent to, but not touching a bottom wall of the crucible, when melting of the calcium fluoride polycrystal material in the crucible has occurred,
    wherein the gas introducing part is made of the same material as the crucible,
    wherein the gas introducing part and the crucible are made of carbon, and
    wherein the movable structure is equipped to position the gas introducing port into the melted calcium fluoride polycrystal material when the gas introducing part is in the second position.

* * * * *